(12) United States Patent
Wang et al.

(10) Patent No.: US 7,696,108 B2
(45) Date of Patent: Apr. 13, 2010

(54) METHOD OF FORMING SHADOW LAYER ON THE WAFER BEVEL

(75) Inventors: Wen-Chieh Wang, Taoyuan County (TW); Jin-Tau Huang, Taoyuan (TW); Wei-Hui Hsu, Taoyuan County (TW); Tse-Yao Huang, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 315 days.

(21) Appl. No.: 11/953,072

(22) Filed: Dec. 9, 2007

(65) Prior Publication Data

US 2009/0023300 A1    Jan. 22, 2009

(30) Foreign Application Priority Data

Jul. 18, 2007    (TW)    ................... 96126126

(51) Int. Cl.
*H01L 21/31* (2006.01)
*H01L 21/469* (2006.01)

(52) U.S. Cl. ............... 438/786; 438/476; 257/E21.412; 257/E21.487

(58) Field of Classification Search .................... 438/96, 438/476, 758, 765, 787, 795, 786; 257/E21.412, 257/E21.487
See application file for complete search history.

(56) References Cited

U.S. PATENT DOCUMENTS

| 5,506,155 | A  | * | 4/1996  | Kaigawa        | 438/476 |
|-----------|----|---|---------|----------------|---------|
| 6,066,570 | A  | * | 5/2000  | Perng et al.   | 438/719 |
| 6,613,973 | B2 | * | 9/2003  | Mukai et al.   | 136/255 |
| 6,767,782 | B2 | * | 7/2004  | Saikawa et al. | 438/233 |
| 6,800,538 | B2 | * | 10/2004 | Furuhashi et al.| 438/476 |
| 2006/0216908 | A1 | * | 9/2006 | Boyle et al.   | 438/455 |
| 2009/0023300 | A1 | * | 1/2009 | Wang et al.    | 438/786 |

* cited by examiner

*Primary Examiner*—Walter L Lindsay, Jr.
(74) *Attorney, Agent, or Firm*—Jianq Chyun IP Office

(57) ABSTRACT

A method of forming a shadow layer on a wafer bevel region is provided. First, a substrate having the wafer bevel region and a central region is provided. Thereafter, an upper insulator and a lower insulator are provided. The upper insulator is disposed on an upper surface of the substrate and at least covers the central region. The lower insulator is disposed on a lower surface of the substrate and at least covers the central region. A shadow layer is then formed on the upper surface which is not covered by the upper insulator and on the lower surface which is not covered by the lower insulator. Next, the upper insulator and the lower insulator are removed.

10 Claims, 3 Drawing Sheets

METHOD OF FORMING SHADOW LAYER ON THE WAFER BEVEL

CROSS-REFERENCE TO RELATED APPLICATION

This application claims the priority benefit of Taiwan application serial no. 96126126, filed on Jul. 18, 2007. The entirety of the above-mentioned patent application is hereby incorporated by reference herein and made a part of this specification.

BACKGROUND OF THE INVENTION

1. Field of the Invention

The present invention relates to a semiconductor manufacturing process, and more particularly to a method of forming a shadow layer on a wafer bevel region.

2. Description of Related Art

In general, the fabrication of an integrated circuit involves forming a multi-layered stacked structure through various techniques. Each layer in the multi-layered stacked structure performs a particular function such as serving as a conductive layer, a dielectric layer, an insulating layer or an adhesion layer for increasing an adhesive strength between two adjacent layers. Frequently, each of the layers is fabricated with use of different materials to enhance the performance of devices. Besides, after the multi-layered stacked structure is formed, an etching process is implemented in most cases so as to pattern the multi-layered stacked structure for forming the required devices.

However, during the implementation of the etching process (especially a plasma etching process), the layers disposed on a wafer bevel region are easily damaged. Thereby, defects may often occur, and the devices are then adversely affected. Thus, in the manufacturing process of a multi-layered stacked structure at present, a shadow ring is usually formed on the wafer bevel region before the etching process is performed so as to protect the layers on the wafer bevel region.

FIGS. 1A through 1C are cross-sectional views illustrating a conventional process of manufacturing a shadow ring on a wafer bevel region.

First, with reference to FIG. 1A, a shadow material layer 106 is formed around a substrate 100. The substrate 100 has a wafer bevel region 102 and a central region 104. A multi-layered stacked structure (not shown) is already formed on the substrate 100. The shadow material layer 106 is usually made of oxide.

Then, with reference to FIG. 1B, a patterned photoresist layer 108 is formed over the substrate 100 to partially cover the shadow material layer 106. The patterned photoresist layer 108 covers the shadow material layer 106 in the wafer bevel region 102.

Next, with reference to FIG. 1C, a wet etching process is performed to remove a portion of the shadow material layer 106 which is free of the patterned photoresist layer 108. Thereafter, the patterned photoresist layer 108 is removed, so as to form a shadow layer 110. The shadow layer 110 surrounding the substrate 100 is usually called the "shadow ring".

However, at least three steps are required during the process of forming the shadow layer 110, and one of the steps must be a photolithography process. Thus, manufacturing costs are increased.

SUMMARY OF THE INVENTION

In view of the foregoing, the present invention is directed to a method of forming a shadow layer on a wafer bevel region. The method is able to simplify manufacturing steps when the shadow layer is formed on the wafer bevel region, so as to reduce manufacturing costs.

The present invention provides a method of forming a shadow layer on a wafer bevel region. In the method, a substrate having a wafer bevel region and a central region is provided at first. Thereafter, an upper insulator and a lower insulator are provided to two opposed side faces of the substrate and the upper insulator is disposed on an upper surface of the substrate and at least covers the central region. The lower insulator is disposed on a lower surface of the substrate and at least covers the central region. A shadow layer is then formed on the upper surface which is not covered by the upper insulator and on the lower surface which is not covered by the lower insulator. Next, the upper insulator and the lower insulator are removed.

According to the method of forming the shadow layer on the wafer bevel region, a material of the shadow layer is silicon oxide or silicon nitride, for example.

According to the method of forming the shadow layer on the wafer bevel region, the shadow layer is formed by performing a plasma-enhanced chemical vapor deposition (PECVD) process, for example.

According to the method of forming the shadow layer on the wafer bevel region, the upper insulator is substantially in contact with the upper surface of the substrate, for example.

According to the method of forming the shadow layer on the wafer bevel region, the lower insulator is substantially in contact with the lower surface of the substrate, for example.

According to the method of forming the shadow layer on the wafer bevel region, a space is formed between the upper insulator and the upper surface of the substrate, for example.

According to the method of forming the shadow layer on the wafer bevel region, an inert gas may be further introduced into the space before the shadow layer is formed.

According to the method of forming the shadow layer on the wafer bevel region, a space is formed between the lower insulator and the lower surface of the substrate, for example.

In the present invention, the upper insulator and the lower insulator cover the central region of the upper and the lower surfaces of the substrate, and the shadow layer is directly formed on the wafer bevel region which is not covered by the upper and the lower insulators. Therefore, the manufacturing process is simplified, and the manufacturing costs are reduced.

In order to make the aforementioned and other objects, features and advantages of the present invention more comprehensible, several embodiments accompanied with figures are described in detail below.

DESCRIPTION OF EMBODIMENTS

Figure 1A:
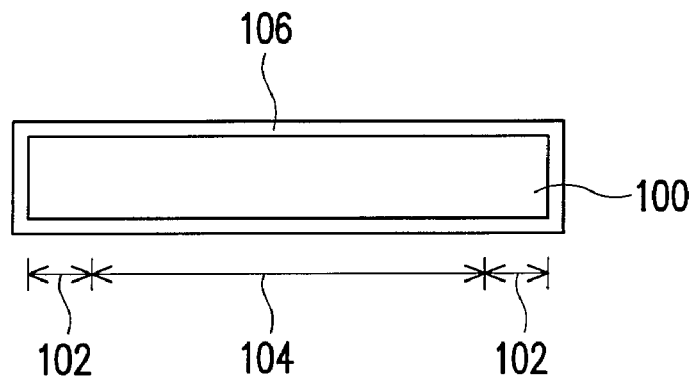
FIGS. 1A through 1C are cross-sectional flowcharts illustrating a conventional process of manufacturing a shadow ring on a wafer bevel region.
Figure 1B:
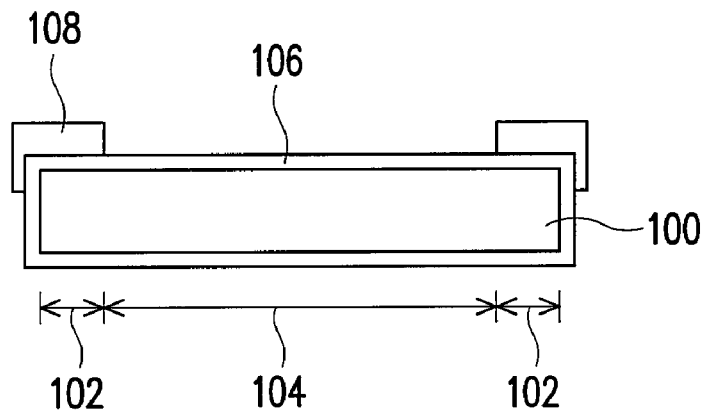
Figure 1C:
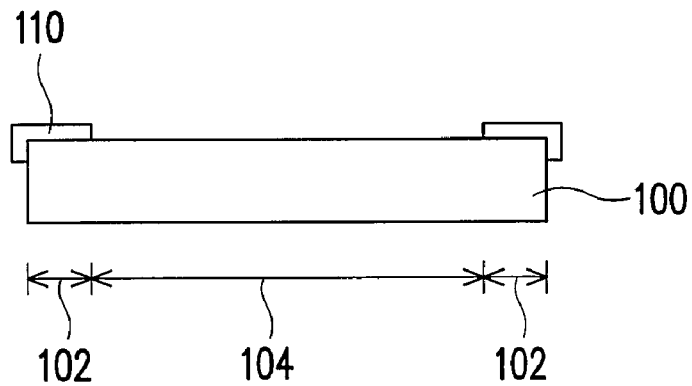
Figure 2A:
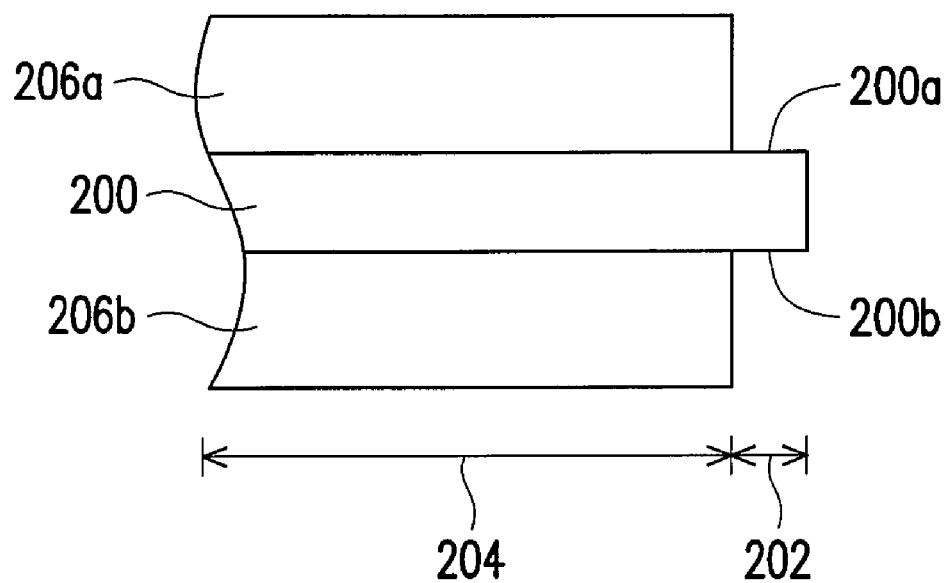
FIGS. 2A through 2C are cross-sectional flowcharts illustrating a process of forming a shadow layer on a wafer bevel region according to an embodiment of the present invention.
Figure 2B:
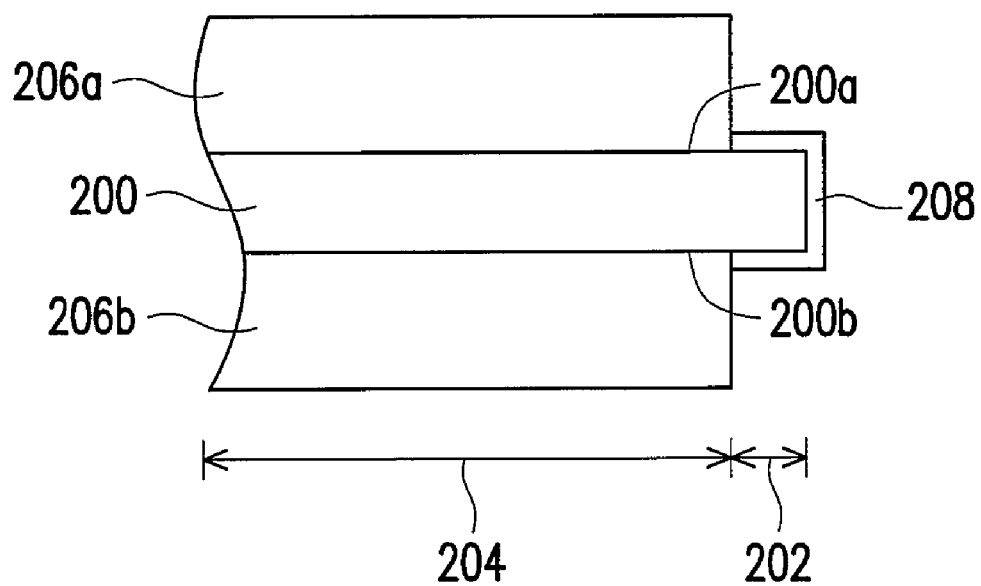
Figure 2C:
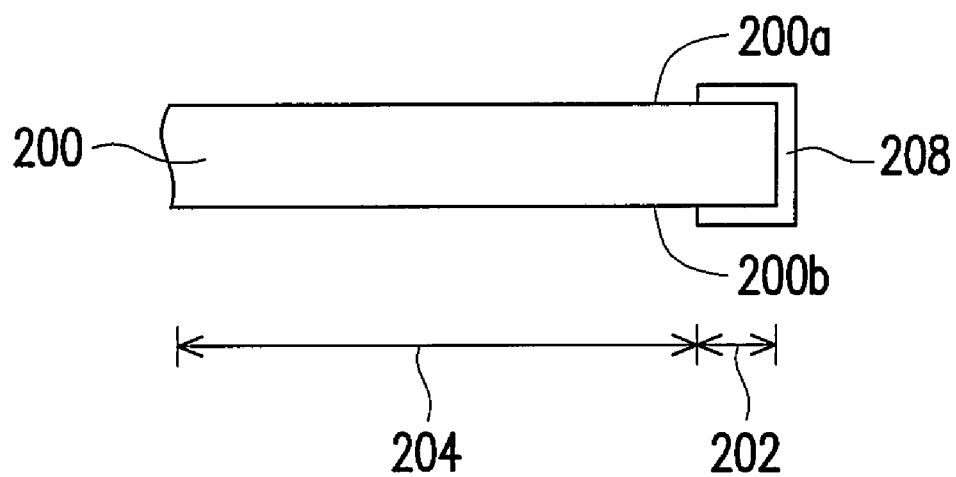

FIGS. 2A through 2C are cross-sectional flowcharts illustrating a process of forming a shadow layer on a wafer bevel region according to an embodiment of the present invention.

First, with reference to FIG. 2A, a substrate 200 having a wafer bevel region 202 and a central region 204 is provided.

In addition, at least a film layer (not shown) is already formed on the substrate 200, for example. Next, an upper insulator 206a is provided on an upper surface 200a of the substrate 200, while a lower insulator 206b is provided on a lower surface 200b of the substrate 200. In the present embodiment, the upper insulator 206a and the lower insulator 206b enclose the central region 204. Besides, the upper insulator 206a is substantially in contact with the upper surface 200a, while the lower insulator 206b is substantially in contact with the lower surface 200b.

Particularly, in a normal manufacturing process, the film layer on the substrate 200 is usually patterned by performing a plasma etching process. Thus, in order to protect the film layer disposed on the wafer bevel region 202 from being damaged and to prevent occurrence of defects during the etching process, the central region 204 of the substrate 200 is firstly covered by the upper insulator 206a and the lower insulator 206b in the present invention, and a shadow layer is then formed on the wafer bevel region 202 of the substrate 200, such that the wafer bevel region 202 can be protected. After that, the etching process is implemented. In addition, existing apparatuses in the machine (i.e. the apparatuses disposed between an upper electrode and a lower electrode in the machine and used for covering the substrate) usually serve as the upper insulator 206a and the lower insulator 206b, and dimensions of the upper insulator 206a and the lower insulator 206b are variable based on manufacturing demands.

For example, in the present embodiment, the shadow layer is to be formed on the whole wafer bevel region 202. Hence, the dimensions of the upper insulator 206a and the lower insulator 206b are sufficient enough to enclose the entire central region 204. In another embodiment, given that the shadow layer merely covers the wafer bevel region 202 of the upper surface 200a, the upper insulator 206a is adopted along with the lower insulator which is capable of covering the entire lower surface 200b. It is of certainty that the dimension of the upper insulator may be different from that of the lower insulator according to other embodiments.

Next, with reference to FIG. 2B, a reactive gas is introduced into the machine by performing a PECVD process, for example, such that a shadow layer 208 is formed on the upper surface 200a which is not covered by the upper insulator 206a and on the lower surface 200b which is not covered by the lower insulator 206b. According to the introduced reactive gas, a material of the shadow layer 208 may be silicon oxide including boron-silicate glass (BSG) and undoped silicate glass (USG), or silicon nitride, for example.

After that, with reference to FIG. 2C, the upper insulator 206a and the lower insulator 206b are removed, and the shadow layer 208 on the wafer bevel region 202 is kept as a shadow ring.

In the present invention, note that "on the surface" may be defined as "being substantially in contact with the surface" or "having a space between the surfaces of the insulator surface and the substrate surface". According to the present embodiment, the upper insulator 206a is substantially in contact with the upper surface 200a, and the lower insulator 206b is also substantially in contact with the lower surface 200b. By contrast, in another embodiment, the space may be formed between the upper insulator and the upper surface of the substrate, and a space may be formed between the lower insulator and the lower surface of the substrate as well.

Figure 3:
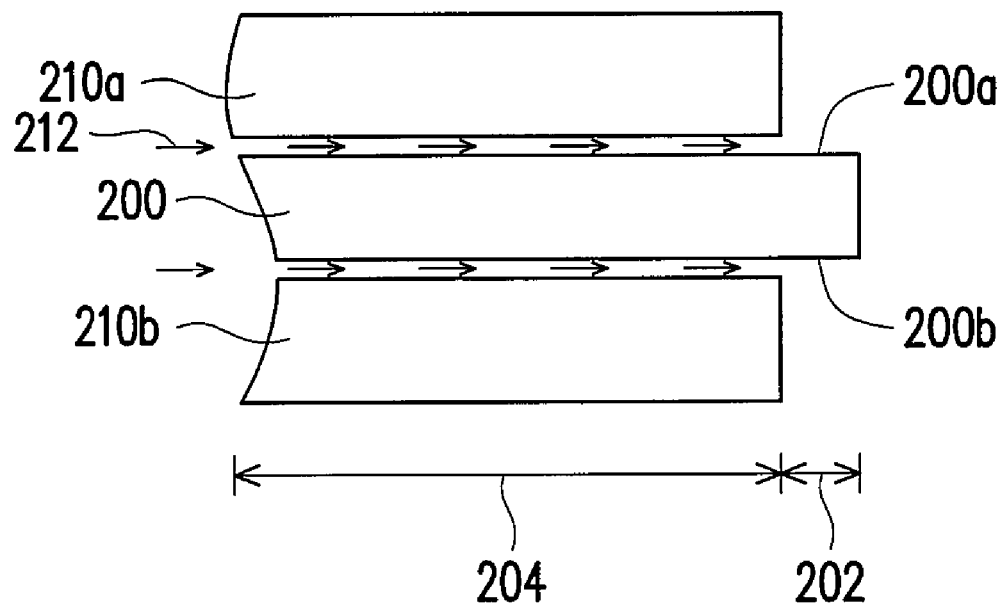
FIG. 3 is a schematic view illustrating an insulator provided on a substrate according to another embodiment of the present invention.

FIG. 3 is a schematic view illustrating an insulator provided on a substrate according to another embodiment of the present invention, in which a space is kept between the upper surface 200a of the substrate and the upper insulator 210a, as well as between the lower surface 200b of the substrate and the lower insulator 210b.

With reference to FIG. 3, an upper insulator 210a and a lower insulator 210b cover the central region 204. Besides, a space is formed between the upper insulator 210a and the upper surface 200a of the substrate 200, and a space is also formed between the lower insulator 210b and the lower surface 200b of the substrate 200. To prevent the introduced reactive gas from entering into the spaces during the formation of the shadow layer 208, an inert gas 212 is required to be introduced into the spaces before the introduction of the reactive gas. Afterwards, the reactive gas is introduced to form the shadow layer 208.

In another embodiment, it is noted that the upper insulator 210a and the lower insulator 210b may have different dimensions based on actual demands.

Additionally, in other embodiments, the upper insulator 210a may be substantially in contact with the upper surface 200a, whereas a space is formed between the lower insulator 210b and the lower surface 200b. In an alternative, the space may be formed between the upper insulator 210a and the upper surface 200a, whereas the lower insulator 210b may be substantially in contact with the lower surface 200b.

To sum up, in the present invention, the upper insulator and the lower insulator cover the central region of the upper and the lower surfaces of the substrate. Thus, it is not necessary to additionally carry out a photolithography process and the etching process after a shadow material layer is constructed on the entire substrate. Instead, according to the present invention, the shadow layer can be directly formed on the wafer bevel region which is not covered by the upper and the lower insulators. Thereby, the manufacturing process is simplified, and the manufacturing costs are reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a shadow layer on a wafer, the method comprising:
    defining a wafer bevel region and a central region on the wafer;
    providing an upper insulator and a lower insulator, wherein the upper insulator is disposed on an upper surface of the wafer and at least covers the central region, while the lower insulator is disposed on a lower surface of the wafer and at least covers the central region;
    forming a shadow layer on the upper surface which is free of the upper insulator and on the lower surface which is free of the lower insulator; and
    removing the upper insulator and the lower insulator.

2. The method of claim 1, wherein a material of the shadow layer comprises silicon oxide, silicon nitride.

3. The method of claim 2, wherein a method of forming the shadow layer comprises performing a plasma-enhanced chemical vapor deposition (PECVD) process.

4. The method of claim 1, wherein the upper insulator is substantially in contact with the upper surface of the wafer.

5. The method of claim 4, wherein the lower insulator is substantially in contact with the lower surface of the wafer.

6. The method of claim 1, wherein a space is formed between the upper insulator and the upper surface of the wafer.

7. The method of claim 6 further comprising introducing an inert gas into the space before the shadow layer is formed.

8. The method of claim 1, wherein a space is formed between the lower insulator and the lower surface of the wafer.

9. The method of claim 6, wherein a space is formed between the lower insulator and the lower surface of the wafer.

10. The method of claim 7, wherein a space is formed between the lower insulator and the lower surface of the wafer so that the inert gas is provided to spaces between the upper insulator and the upper surface of the wafer and between the lower insulator and the lower surface of the wafer.

* * * * *